United States Patent
Choi

(10) Patent No.: US 9,159,389 B2
(45) Date of Patent: Oct. 13, 2015

(54) SEMICONDUCTOR MEMORY APPARATUS

(71) Applicant: SK hynix Inc., Icheon-si Gyeonggi-do (KR)

(72) Inventor: Hoon Choi, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/244,153

(22) Filed: Apr. 3, 2014

(65) Prior Publication Data

US 2015/0187401 A1    Jul. 2, 2015

(30) Foreign Application Priority Data

Dec. 30, 2013  (KR) .................... 10-2013-0167038

(51) Int. Cl.
| | |
|---|---|
| *G11C 7/22* | (2006.01) |
| *G11C 11/4076* | (2006.01) |
| *G11C 7/10* | (2006.01) |
| *G11C 8/18* | (2006.01) |
| *G11C 11/408* | (2006.01) |
| *G11C 29/02* | (2006.01) |

(52) U.S. Cl.
CPC ............... *G11C 7/222* (2013.01); *G11C 7/225* (2013.01); *G11C 7/1006* (2013.01); *G11C 7/1051* (2013.01); *G11C 7/1066* (2013.01); *G11C 8/18* (2013.01); *G11C 11/4076* (2013.01); *G11C 29/023* (2013.01)

(58) Field of Classification Search
CPC .. G11C 7/222; G11C 11/4076; G11C 29/023; G11C 7/1051; G11C 7/1006; G11C 8/18; G11C 7/22

USPC ................ 365/194, 189.17, 233.1, 233.5
See application file for complete search history.

(56) References Cited

U.S. PATENT DOCUMENTS

| | | | | |
|---|---|---|---|---|
| 2004/0105292 | A1* | 6/2004 | Matsui | 365/63 |
| 2007/0069773 | A1* | 3/2007 | Choi | 327/158 |
| 2011/0058437 | A1* | 3/2011 | Miyano | 365/222 |
| 2011/0317503 | A1* | 12/2011 | Ishikawa | 365/194 |

FOREIGN PATENT DOCUMENTS

| | | |
|---|---|---|
| KR | 1020070036562 A | 4/2007 |
| KR | 100863016 B1 | 10/2008 |

* cited by examiner

*Primary Examiner* — Ly D Pham
(74) *Attorney, Agent, or Firm* — William Park & Associates Ltd.

(57) ABSTRACT

A semiconductor memory apparatus may include a clock buffer configured to receive an external clock signal, buffer the external clock signal in response to an activation control signal, and the clock buffer configured to output an internal clock signal in response to an activation control signal. The semiconductor memory apparatus may also include a delay-locked loop block configured to receive the internal clock signal outputted from the clock buffer and compare phases of the internal clock signal and a feedback clock signal, and responsively generate a delay-locked clock signal. The semiconductor memory apparatus may also include an operation control block configured to responsively generate the activation control signal which is received by the clock buffer in accordance with a result of comparing the phases of the internal clock signal and the feedback clock signal, in response to receiving a read signal.

16 Claims, 4 Drawing Sheets

SEMICONDUCTOR MEMORY APPARATUS

CROSS-REFERENCES TO RELATED APPLICATION

The present application claims priority under 35 U.S.C. §119(a) to Korean application number 10-2013-0167038, filed on Dec. 30, 2013, in the Korean Intellectual Property Office, which is incorporated herein by reference in its entirety.

BACKGROUND

1. Technical Field

Various embodiments generally relate to a semiconductor integrated circuit, and more particularly, to a semiconductor memory apparatus.

2. Related Art

When a semiconductor memory apparatus operates at a high speed, the semiconductor memory apparatus may be configured to operate in synchronization with a clock signal.

That is to say, the semiconductor memory apparatus synchronizes a signal with the clock signal, when this signal is to be transmitted outside of the semiconductor memory apparatus.

Since the semiconductor memory apparatus is a device which is configured to store data received from an external device and output stored data to the external device the semiconductor memory apparatus may include a circuit for transmitting and receiving data to and from the external device. Thus, this circuit for transmitting and receiving data becomes very important.

For example, when outputting stored data to the external device, the semiconductor memory apparatus may use a delay-locked loop (DLL) circuit for transmitting stored data in synchronization with a received clock signal. This received clock signal may be received from the external device.

As such, development of a DLL circuit which helps reduce power consumption by the semiconductor memory apparatus is desired after in the art.

SUMMARY

In an embodiment, semiconductor memory apparatus may include a clock buffer configured to receive an external clock signal, buffer the external clock signal in response to an activation control signal, and the clock buffer configured to output an internal clock signal in response to an activation control signal. The semiconductor memory apparatus may also include a delay-locked loop block configured to receive the internal clock signal outputted from the clock buffer and compare phases of the internal clock signal and a feedback clock signal, and responsively generate a delay-locked clock signal. The semiconductor memory apparatus may also include an operation control block configured to responsively generate the activation control signal which is received by the clock buffer in accordance with a result of comparing the phases of the internal clock signal and the feedback clock signal, in response to receiving a read signal.

In an embodiment, a semiconductor memory apparatus may include a clock buffer configured to buffer an external clock signal in response to an activation control signal and the clock buffer configured to output an internal clock signal in response to an activation control signal, and a delay line configured to responsively delay the internal clock signal in response to a delay control signal and responsively generate a delay-locked clock signal. The semiconductor memory apparatus may also include a replica configured to receive the delay-locked clock signal, delay the delay-locked clock signal by a predetermined time, and responsively generate a feedback clock signal, and a phase comparison unit configured to compare phases of the internal clock signal and the feedback clock signal and responsively generate a phase comparison signal. The semiconductor memory apparatus may also include a delay control unit configured to responsively generate the delay control signal in response to the phase comparison signal, and an operation control block configured to responsively generate the activation control signal in response to a read signal and the phase comparison signal.

In an embodiment, a semiconductor apparatus may include an operation control block configured to responsively generate an activation control signal in response to receiving a read signal and in response to a result of comparing an internal clock signal and a feedback clock signal, and a delay-locked loop block configured to perform a delay locking operation for matching phases of the internal clock signal and the feedback clock signal, in response to the activation control signal that was generated by the operation control block.

DETAILED DESCRIPTION

Hereinafter, examples of semiconductor memory apparatuses will be described below with reference to the accompanying drawings through various examples of embodiments.

Figure 1:
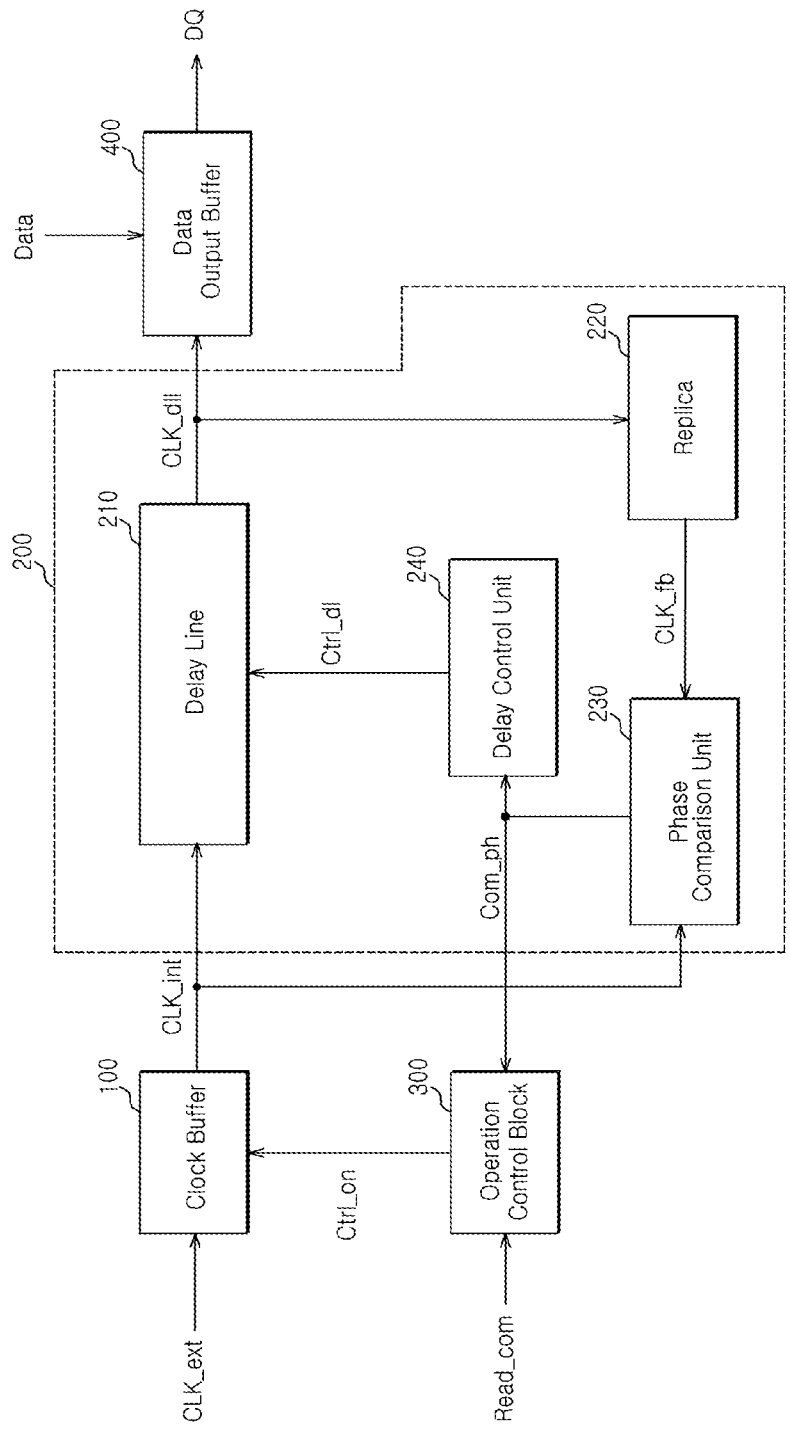
FIG. 1 is a configuration diagram representation of a semiconductor memory apparatus in accordance with an embodiment.

Referring to FIG. 1, a semiconductor memory apparatus may include a clock buffer 100, a delay-locked loop block 200, an operation control block 300, and a data output buffer 400.

The clock buffer 100 may be configured to buffer an external clock signal CLK_ext in response to an activation control signal Ctrl_on and output an internal clock signal CLK_int. For example, amongst other examples, the clock buffer 100 may buffer the external clock signal CLK_ext and output the internal clock signal CLK_int when the activation control signal Ctrl_on is enabled. Also, the clock buffer 100 may lock the internal clock signal CLK_int to a specified voltage level regardless of the external clock signal CLK_ext when the activation control signal Ctrl_on is disabled.

The delay-locked loop block 200 may be configured to compare the phases of the internal clock signal CLK_int and a feedback clock signal CLK_fb. Then generate a delay-locked clock signal CLK_dll. For example, the delay-locked loop block 200 may include a delay line 210, and a replica 220. Also for example the delay-locked loop block 200 may include a phase comparison unit 230, and a delay control unit 240.

The delay line 210 may be configured to delay the internal clock signal CLK_int with a delay time according to a delay control signal Ctrl_dl. Then generate the delay-locked clock signal CLK_dll.

The replica 220 may be configured to delay the delay-locked clock signal CLK_dll by a predetermined time. Then generate the feedback clock signal CLK_fb. The replica 220 may model the total delay time of the semiconductor memory apparatus. For example, amongst other examples, the replica 220 may model a time from after a data output command is received to when data is outputted.

The phase comparison unit 230 may be configured to compare the phases of the feedback clock signal CLK_fb and the internal clock signal CLK_int. Then generate a phase comparison signal Com_ph. For example, amongst other examples, the phase comparison unit 230 may enable the phase comparison signal Com_ph when the phase of the feedback clock signal CLK_fb is earlier than the phase of the internal clock signal CLK_int. The phase comparison unit 230 may also, for example, amongst other examples, disable the phase comparison signal Com_ph when the phase of the feedback clock signal CLK_fb is later than the phase of the internal clock signal CLK_int.

The delay control unit 240 may be configured to generate the delay control signal Ctrl_dl in response to the phase comparison signal Com_ph. For example, amongst other examples, the delay control unit 240 may generate the delay control signal Ctrl_dl which lengthens the delay time of the delay line 210 when the phase comparison signal Com_ph is enabled. For example, amongst other examples, the delay control unit 240 may generate the delay control signal Ctrl_dl which shortens the delay time of the delay line 210 when the phase comparison signal Com_ph is disabled Configuring the delay-locked loop block 200 in this way may eventually generate the delay-locked clock signal CLK_dll having a period when the phases of the internal clock signal CLK_int and the feedback clock signal CLK_fb are the same or substantially the same.

The operation control block 300 may be configured to generate the activation control signal Ctrl_on according to a result of comparing the phases of the internal clock signal CLK_int and the feedback clock signal CLK_fb. That is, according to the phase comparison signal Com_ph, and in response to a read signal Read_com. For example, amongst other examples, the operation control block 300 may disable a preliminary activation control signal Pre_on when the phase of the internal clock signal CLK_int is earlier than the phase of the feedback clock signal CLK_fb at a first timing and the phase of the internal clock signal CLK_int is later than the phase of the feedback clock signal CLK_fb at a second timing. Then output the preliminary activation control signal Pre_on as the activation control signal Ctrl_on when the read signal Read_com is disabled. The operation control block 300 may disable the preliminary activation control signal Pre_on when the phase of the internal clock signal CLK_int is later than the phase of the feedback clock signal CLK_fb at the first timing and when the phase of the internal clock signal CLK_int is earlier than the phase of the feedback clock signal CLK_fb at the second timing. Then output the preliminary activation control signal Pre_on as the activation control signal Ctrl_on when the read signal Read_com is disabled. Further, the operation control block 300 may enable the preliminary activation control signal Pre_on when the phase of the internal clock signal CLK_int is earlier or later than the phase of the feedback clock signal CLK_fb at both the first timing and the second timing. Then output the preliminary activation control signal Pre_on as the activation control signal Ctrl_on when the read signal Read_com is disabled. Additionally, the operation control block 300 may enable the activation control signal Ctrl_on regardless of the preliminary activation control signal Pre_on when the read signal Read_com is enabled.

As described above, the operation control block 300 may generate the preliminary activation control signal Pre_on according to a result of comparing the phases of the feedback clock signal CLK_fb and the internal clock signal CLK_int. Thus, the operation control block 300 may generate the preliminary activation control signal Pre_on by comparing the phase comparison signal Com_ph at the first timing and the phase comparison signal Com_ph at the second timing.

As such, the operation control block 300 may generate the preliminary activation control signal Pre_on by sensing a transition of the phase comparison signal Com_ph. Also, the operation control block 300 may disable the preliminary activation control signal Pre_on when the phase comparison signal Com_ph at the first timing and the phase comparison signal Com_ph at the second timing are different from each other. The operation control block 300 may enable the preliminary activation control signal Pre_on when the phase comparison signal Com_ph at the first timing and the phase comparison signal Com_ph at the second timing are the same with each other or substantially the same with each other. The preliminary activation control signal Pre_on generated in this way may be outputted as the activation control signal Ctrl_on when the read signal Read_com is disabled, that is, when the semiconductor memory apparatus does not perform a read operation. Also, the activation control signal Ctrl_on is enabled regardless of the preliminary activation control signal Pre_on when the read signal Read_com is enabled, that is, when the semiconductor memory apparatus performs the read operation.

Figure 2:
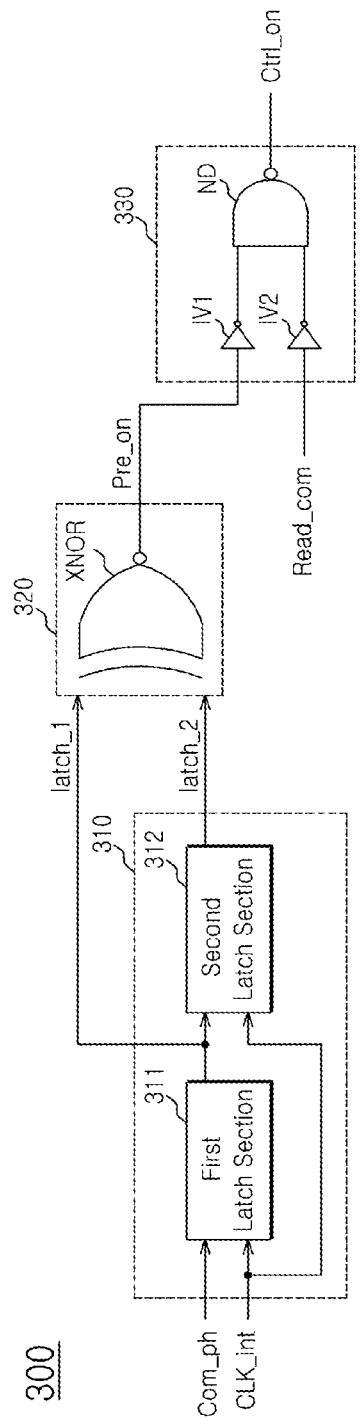
FIG. 2 is a configuration diagram representation of the operation control block shown in FIG. 1.

Referring to FIG. 2, the operation control block 300 operating as described above with reference to FIG. 1, amongst other examples, may include a latch signal generation unit 310, a latch signal comparison unit 320, and an output control unit 330.

The latch signal generation unit 310 may be configured to latch the phase comparison signal Com_ph of the first tinning and the phase comparison signal Com_ph of the second tinning in response to the internal clock signal CLK_int. Thus, generating a first latch signal latch_1 and a second latch signal latch_2.

The latch signal generation unit 310 may include a first latch section 311. The latch signal generation unit 310 may also include a second latch section 312. The first latch section 311 may be configured to latch the phase comparison signal Com_ph in response to the internal clock signal CLK_int. Then output the first latch signal latch_1. The second latch section 312 may be configured to latch the first latch signal latch_1 in response to the internal clock signal CLK_int. Then output the second latch signal latch_2.

The first latch section 311 may latch the phase comparison signal Com_ph when the internal clock signal CLK_int first transitions to a high level, that is, at the first timing. When the internal clock signal CLK_int second transitions to the high level, the second latch section 312 may latch the phase comparison signal Com_ph of the time when the internal clock signal CLK_int first transitions to the high level, and the first latch 311 latches the phase comparison signal Com_ph of the second timing. Therefore, the first latch section 311 and the second latch section 312 latch the phase comparison signal Com_ph with a time difference corresponding to one cycle of the internal clock signal CLK_int, and respectively generates the first and second latch signals latch_1 and latch_2.

When the first and second latch signals latch_1 and latch_2 have the same level the latch signal comparison unit 320 may be configured to enable the preliminary activation control signal Pre_on. When the first and second latch signals latch_1 and latch_2 have different levels the latch signal comparison unit 320 may be configured to disable the preliminary activation control signal Pre_on.

The latch signal comparison unit 320 may include an exclusive NOR gate XNOR. The exclusive NOR gate XNOR may be configured to receive the first and second latch signals latch__1 and latch__2. Then output the preliminary activation control signal Pre_on.

When the read signal Read_com is enabled the output control unit 330 may be configured to enable the activation control signal Ctrl_on regardless of the preliminary activation control signal Pre_on. When the read signal Read_com is disabled the output control unit 330 may be configured to output the preliminary activation control signal Pre_on as the activation control signal Ctrl_on.

The output control unit 330 may include, for example, first and second inverters IV1 and IV2 and a NAND gate ND. The first inverter IV1 may receive the preliminary activation control signal Pre_on. The second inverter IV2 may receive the read signal Read_com. The NAND gate ND may receive the output signals of the first and second inverters IV1 and IV2. Then output the activation control signal Ctrl_on.

Referring to FIG. 1 the data output buffer 400 may be configured to receive data Data and output the received data Data as data DQ, in synchronization with the delay-locked clock signal CLK_dll.

Operations of the semiconductor memory apparatus, configured as mentioned above, will be described below.

In the read operation, for example, when the read signal Read_com is enabled, the operation control block 300 may enable the activation control signal Ctrl_on.

If the activation control signal Ctrl_on is enabled, the clock buffer 100 may be activated, buffering the external clock signal CLK_ext, and outputting the internal clock signal CLK_int.

The internal clock signal CLK_int may be delayed through the delay-locked loop block 200 and may be outputted as the delay-locked clock signal CLK_dll. At this time, the delay-locked loop block 200 may be activated, and may repeat the operations of discriminating the phase differences between the feedback clock signal CLK_fb generated by delaying the delay-locked clock signal CLK_dll and the internal clock signal CLK_int, and then determining the delay time of the delay line 210 according to the discriminated phase difference.

The data output buffer 400 may synchronize the data Data with the delay-locked clock signal CLK_dll. Then output the output data DQ.

When not in the read operation, For example, when the read signal Read_com is disabled, the operation control block 300 may generate the activation control signal Ctrl_on according to the result of discriminating the phase difference of the feedback clock signal CLK_fb and the internal clock signal CLK_int, that is, the phase comparison signal Com_ph.

The operation control block 300 may disable the activation control signal Ctrl_on when it is determined that the phases of the feedback clock signal CLK_fb and the internal clock signal CLK_int are the same for example, when the phase comparison signal Com_ph has different voltage levels at the first timing and different voltage levels at the second timing.

If the activation control signal Ctrl_on is disabled, the delay-locked loop block 200 may receive the internal clock signal CLK_int which is locked to a specified level, and does not discriminate the phase difference of the feedback clock signal CLK_fb and the internal clock signal CLK_int. That is to say, the delay-locked loop block 200 is deactivated, and the delay time of the delay line 210 is locked as well.

Consumption of power needed to change the delay time of the delay line 210 may be saved because the delay-locked loop block 200 does not perform the operation of changing the delay time of the delay line 210.

The operation control block 300 may enable the activation control signal Ctrl_on when it is determined that the phases of the feedback clock signal CLK_fb and the internal clock signal CLK_int are different from each other, for example, when the phase comparison signal Com_ph has the same voltage level at the first timing and the second timing.

If the activation control signal Ctrl_on is enabled, the clock buffer 100 may be activated, buffering the external clock signal CLK_ext, and outputting the internal clock signal CLK_int.

The internal clock signal CLK_int may be delayed through the delay-locked loop block 200 and may be outputted as the delay-locked clock signal CLK_dll. At this time, the delay-locked loop block 200 is activated, and may repeat the operations of discriminating the phase difference between the feedback clock signal CLK_fb generated by delaying the delay-locked clock signal CLK_dll and the internal clock signal CLK_int and determining the delay time of the delay line 210 according to the discriminated phase difference.

As is apparent from the above descriptions since a delay-locked loop is deactivated in the case where it is determined that a feedback clock and an internal clock have the same phase when not in a read operation, power consumption may be reduced in a semiconductor memory apparatus.

Figure 3:
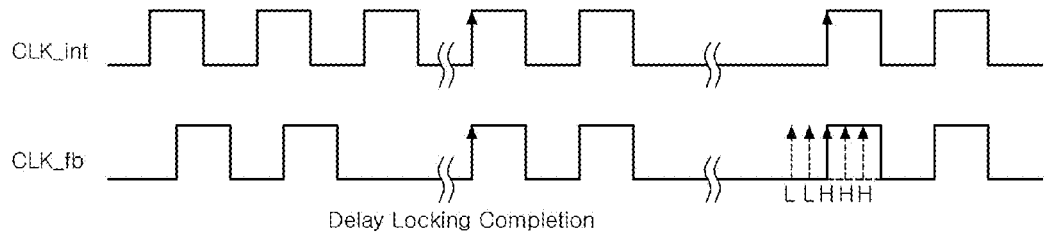
FIG. 3 is a timing diagram illustrating example operations of a semiconductor apparatus in accordance with an embodiment.

FIG. 3 is a timing diagram illustrating the operations of a semiconductor apparatus. Referring to FIG. 3, when a phase difference exists between the internal clock signal CLK_int and the feedback clock signal CLK_fb, the delay-locked loop block 200 may perform a delay locking operation to match the phases of the two signals. If the phases of the internal clock signal CLK_int and the feedback clock signal CLK_fb match each other, the delay-locked loop block 200 may complete the delay locking operation. Thereafter, whether the delay-locked loop block 200 is to be operated or not may be determined according to a result of comparing the phase of the feedback clock signal CLK_fb and the phase of the internal clock signal CLK_int.

For example, amongst other example, in the case where the phase comparison signal Com_ph of a low level or a high level is consecutively generated as the phase of the feedback clock signal CLK_fb is earlier or later than the phase of the internal clock signal CLK_int, the operation control block 300 may enable the activation control signal Ctrl_on. Accordingly, the clock buffer 100 may continuously provide the buffered external clock signal CLK_ext as the internal clock signal CLK_int, and the delay-locked loop block 200 may perform the delay locking operation. In the cases where the phase of the feedback clock signal CLK_fb is slightly earlier or later than the phase of the internal clock signal CLK_int and the phase of the feedback clock signal CLK_fb matches the phase of the internal clock signal CLK_int, the phase comparison signal Com_ph may transition from the high level to the low level or from the low level to the high level, and the operation control block 300 may disable the activation control signal Ctrl_on according to the phase transition of the phase comparison signal Com_ph. Accordingly, the clock buffer 100 may lock the internal clock signal CLK_int to a specified level, and the delay-locked loop block 200 may not perform the delay locking operation.

Figure 4:
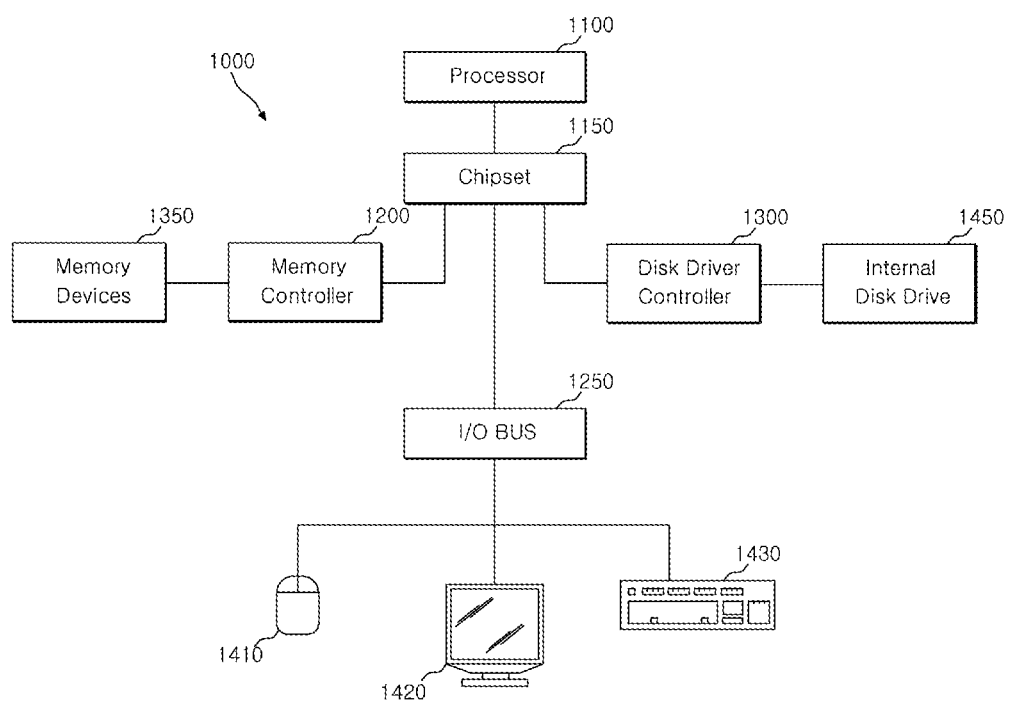
FIG. 4 illustrates a block diagram representation of a system employing the semiconductor memory apparatus in accordance with the embodiments discussed above with relation to FIGS. 1-3.

The semiconductor memory apparatus or semiconductor apparatus discussed above is particular useful in the design of memory devices, processors, and computer systems. For example, referring to FIG. 4, a block diagram of a system employing the semiconductor memory apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory apparatus or semiconductor apparatus as discussed above with reference to FIGS. 1-3. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor memory apparatus or semiconductor apparatus as discussed above with relation to FIGS. 1-3, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 4 is merely one example of a system employing the semiconductor memory apparatus or semiconductor apparatus as discussed above with relation to FIGS. 1-3. In alternate embodiments, such as cellular phones or digital cameras, the components may differ from the embodiments shown in FIG. 4.

While various embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a clock buffer configured to receive an external clock signal, buffer the external clock signal in response to an activation control signal, and the clock buffer configured to output an internal clock signal in response to the activation control signal;
   a delay-locked loop block configured to receive the internal clock signal outputted from the clock buffer and generate a phase comparison signal and a delay-locked clock by comparing phases of the internal clock signal and a feedback clock signal; and
   an operation control block configured to enable the activation control signal by sensing a transition of the phase comparison signal when a read signal is disabled.

2. The semiconductor memory apparatus according to claim 1, wherein the operation control block is configured to disable a preliminary activation control signal when the phase of the internal clock signal is earlier than the phase of the feedback clock signal at a first timing and the phase of the internal clock signal is later than the phase of the feedback clock signal at a second timing, and is configured to output the preliminary activation control signal as the activation control signal when the read signal is disabled.

3. The semiconductor memory apparatus according to claim 2, wherein the operation control block is configured to enable the preliminary activation control signal when the phase of the internal clock signal is earlier than the phase of the feedback clock signal at the first and second timings, and output the preliminary activation control signal as the activation control signal when the read signal is disabled.

4. The semiconductor memory apparatus according to claim 3, wherein the operation control block is configured to enable the preliminary activation control signal when the phase of the internal clock signal is later than the phase of the feedback clock signal at the first and second timings, and outputs the preliminary activation control signal as the activation control signal when the read signal is disabled.

5. The semiconductor memory apparatus according to claim 1, wherein the clock buffer is configured to output the external clock signal as the internal clock signal when the activation control signal is enabled, and locks the internal clock signal to a specified voltage level when the activation control signal is locked.

6. A semiconductor memory apparatus comprising:
   a clock buffer configured to buffer an external clock signal in response to an activation control signal and the clock buffer configured to output an internal clock signal in response to the activation control signal;
   a delay line configured to responsively delay the internal clock signal in response to a delay control signal and responsively generate a delay-locked clock signal;

a replica configured to receive the delay-locked clock signal, delay the delay-locked clock signal by a predetermined time, and responsively generate a feedback clock signal;

a phase comparison unit configured to compare phases of the internal clock signal and the feedback clock signal and responsively generate a phase comparison signal;

a delay control unit configured to responsively generate the delay control signal in response to the phase comparison signal; and an operation control block configured to enable the activation control signal by sensing a transition of the phase comparison signal when a read signal is disabled.

7. The semiconductor memory apparatus according to claim 6, further comprising:

a data output buffer configured to receive data and output the data as output data in synchronization with the delay-locked clock signal.

8. The semiconductor memory apparatus according to claim 6, wherein the operation control block is configured to enable the activation control signal when the read signal is enabled, and wherein the operation control block is configured to enable the activation control signal when the read signal is disabled and a level of the phase comparison signal is retained.

9. The semiconductor memory apparatus according to claim 8, wherein the operation control block is configured to disable the activation control signal when the read signal is disabled and when the phase comparison signal at a first timing and the phase comparison signal at a second timing are different from each other, and wherein the operation control block is configured to enable the activation control signal when the read signal is disabled and when the phase comparison signal at the first timing and the phase comparison signal at the second timing are the same with each other or are substantially the same with each other.

10. The semiconductor memory apparatus according to claim 9, wherein the operation control block comprises:

a latch signal generation unit configured to responsively latch the phase comparison signal of the first timing in response to the internal clock signal, responsively latch the phase comparison signal of the second timing, and responsively generate a first latch signal and a second latch signal;

a latch signal comparison unit configured to compare whether the first and second latch signals are the same with or different from each other, and responsively generate a preliminary activation control signal; and an output control unit configured to responsively output the preliminary activation control signal as the activation control signal in response to the read signal.

11. The semiconductor memory apparatus according to claim 10, wherein the latch signal generation unit comprises:

a first latch section configured to responsively latch the phase comparison signal in response to the internal clock signal and then output the first latch signal; and a second latch section configured to responsively latch the first latch signal in response to the internal clock signal and then output the second latch signal.

12. The semiconductor memory apparatus according to claim 10, wherein the latch signal comparison unit is configured to disable the activation control signal when the first latch signal and the second latch signal have different voltage logic levels, and the latch signal comparison unit is configured to enable the activation control signal when the first latch signal and the second latch signal have the same voltage logic level.

13. A semiconductor apparatus comprising:

an operation control block configured to enable an activation control signal by sensing a transition of a phase comparison signal when a read signal is disabled; and a delay-locked loop block configured to perform a delay locking operation for matching phases of an internal clock signal and a feedback clock signal, in response to the activation control signal that was generated by the operation control block and generate the phase comparison signal by comparing the internal clock and the feedback clock signal.

14. The semiconductor apparatus according to claim 13, wherein the operation control block is configured to disable a preliminary activation control signal when the phase of the internal clock signal is earlier than the phase of the feedback clock signal at a first timing and the phase of the internal clock signal is later than the phase of the feedback clock signal at a second timing, and the operation control block is configured to output the preliminary activation control signal as the activation control signal when the read signal is disabled.

15. The semiconductor apparatus according to claim 14, wherein the operation control block is configured to enable the preliminary activation control signal when the phase of the internal clock signal is earlier than the phase of the feedback clock signal at the first and second timings, and the operation control block is configured to output the preliminary activation control signal as the activation control signal when the read signal is disabled.

16. The semiconductor apparatus according to claim 15, wherein the operation control block is configured to enable the preliminary activation control signal when the phase of the internal clock signal is later than the phase of the feedback clock signal at the first and second timings, and the operation control block is configured to output the preliminary activation control signal as the activation control signal when the read signal is disabled.

* * * * *